United States Patent

Okubo et al.

[11] Patent Number: 6,156,218
[45] Date of Patent: Dec. 5, 2000

[54] METHOD OF PRETREATMENT FOR ELECTROLESS NICKEL PLATING

[75] Inventors: Toshikazu Okubo; Yoshiyuki Hisumi, both of Ibaraki-Ken, Japan

[73] Assignee: Japan Energy Corporation, Japan

[21] Appl. No.: 09/355,651

[22] PCT Filed: Dec. 8, 1998

[86] PCT No.: PCT/JP98/05537

§ 371 Date: Aug. 2, 1999

§ 102(e) Date: Aug. 2, 1999

[87] PCT Pub. No.: WO99/31293

PCT Pub. Date: Jun. 24, 1999

[30] Foreign Application Priority Data

Dec. 18, 1997 [JP] Japan ............................ 9/363899

[51] Int. Cl.⁷ .............................. B05D 1/38; B05D 3/10
[52] U.S. Cl. ........................ 216/13; 216/78; 427/305; 427/328; 427/264; 427/271; 427/98; 427/405; 427/421; 427/437; 427/438
[58] Field of Search .................... 427/304, 305, 427/328, 421, 437, 438, 444, 264, 271, 98, 405; 216/13, 78

[56] References Cited

U.S. PATENT DOCUMENTS

| | | | |
|---|---|---|---|
| 3,607,353 | 9/1971 | Abu-Isa | 117/47 |
| 3,857,724 | 12/1974 | Bakos | 117/47 A |
| 3,929,483 | 12/1975 | Wainer et al. | 96/38.4 |
| 5,194,367 | 3/1993 | Yamada et al. | 430/363 |
| 5,648,125 | 7/1997 | Cane | 427/534 |

FOREIGN PATENT DOCUMENTS

| | | |
|---|---|---|
| 8-269726 | 10/1996 | Japan . |
| 9-176864 | 7/1997 | Japan . |

OTHER PUBLICATIONS

English Abstract of the Japanese publication No. 09–176864.

English Abstract of the Japanese publication No. 08–269726.

*Primary Examiner*—Shrive Beck
*Assistant Examiner*—Michael Barr
*Attorney, Agent, or Firm*—Howson and Howson

[57] ABSTRACT

A method for preventing formation of a "bridge" is provided for electrolessly plated nickel or gold between copper patterns. A circuit board having a copper pattern is immersed in a pretreatment solution containing thiosulfate for electroless nickel plating, or the pretreatment solution is sprayed over the board. The pretreatment solution may be incorporated with an additive, such as a pH adjustor, complexing agent, surfactant or corrosion inhibitor.

5 Claims, No Drawings

METHOD OF PRETREATMENT FOR ELECTROLESS NICKEL PLATING

TECHNICAL FIELD

This invention relates to a pretreatment solution for electroless nickel plating, method for pretreatment and method for electroless nickel plating.

BACKGROUND ART

Many printed circuit board are finished by electroless nickel/gold plating. This step follows etching of copper circuit and coating of solder resist, and deposits electrolessly plated nickel and gold films, selectively on exposed copper portions.

Electroless nickel plating follows several pretreatment steps, in which boards are immersed in a series of pretreatment solutions. One of the pretreatment steps is activator, in which Pd catalyst is attached on the exposed copper portions in order to initiate deposition of electroless nickel plating, which is followed by electroless gold plating.

Such an electroless nickel plating step, however, is frequently accompanied by a phenomenon in which nickel is deposited not only on the copper circuits but also on nearby insulator sections.

This phenomenon is called "bridging", "excess plating" or "bleeding", depending on the communities and the organizations.

Recently, printed circuit boards are increasingly required to have circuits with narrower width of line and space. This affects that probability of defects caused by bridging, such as short-circuit, highly increases.

Probability of occurrence of the bridging phenomenon significantly increase in boards prepared by build-up methods, which involve attachment of Pd catalyst on resin surface, electroless copper plating, electrolytic copper plating and formation of circuits by etching of the deposited copper layer. Pd catalyst is basically dissolved in copper chloride and iron chloride solutions used as etchant for circuit patterning. But, if it partially remains, bridging of electrolessly plated nickel are easily occurred on the residual Pd catalyst. As a result, it causes serious problem, because even one short-circuit can damage whole pattern.

Prevention of this phenomenon needs very strict control of the electroless nickel plating solution composition and stirring condition.

It is an object of the present invention to establish a technique which prevents "bridging" by electroless nickel/gold plating between the copper patterns.

The inventors of the present invention have found, after extensive studies to solve the above problems, that the "bridging" phenomenon can be efficiently prevented by immersing the board in a solution containing a thiosulfate immediately before the pretreatment for electroless nickel plating, comprising a series of steps of degreasing, soft etching, acid treatment and activator treatment.

Furthermore, they have also found that use of permanganate treatment and neutralization steps before the thiosulfate treatment is effective, when the Pd catalyst is deposited on the side walls of the holes, prepared in the boards by drilling or the other methods.

SUMMARY OF THE INVENTION

The present invention provides a pretreatment solution for the electroless nickel plating of a printed circuit board. The pretreatment solution according to the present invention contains a thiosulfate as a major ingredient. Preferably, the circuit board has an etched copper pattern, and is immersed in, or sprayed with, the pretreatment solution before the circuit board is electrolessly plated with nickel. The pretreatment solution can also include additives, such as, a pH adjuster, a complexing agent, a surfactant, and a corrosion inhibitor.

According to another aspect of the present invention, a method is provided for pretreating a circuit board. The method includes immersing the circuit board in a pretreatment solution containing a thiosulfate. Alternatively, the pretreatment solution can be sprayed onto the circuit board. Preferably, the circuit board is treated with a permanganate and neutralized before the circuit board is immersed in, or sprayed with, the pretreatment solution.

DETAILED DESCRIPTION OF THE PREFERRED EMBODIMENT

Methods for electrolessly forming nickel alloys, such as Ni—P and Ni—B, and pure nickel are within the scope of the electroless nickel plating described in the present invention.

The pretreatment solution of the present invention for electroless nickel plating contains a thiosulfate as the major ingredient.

Concentration of the thiosulfate is preferably in a range from 0.01 to 500 g/L. The thiosulfate cannot sufficiently exhibit its inherent effects, if it presents at a too low concentration. The upper limit of its concentration is determined by the solubility. Thiosulfates useful for the present invention include sodium, potassium and ammonium thiosulfate. These compounds inactivates the Pd catalyst remaining in the space between the circuits to prevent "bridging" electroless nickel deposition.

The pretreatment solution of the present invention may be incorporated with a citrate, phosphate, pyrophosphate, tetraborate or boric acid as the pH adjuster. It is adequate to keep the solution at a pH level of 4 or more but 11 or less (i.e., in a weak acidic to alkaline region) for stability of the thiosulfate, although its pH level itself is not limited.

The pretreatment solution of the present invention to immerse copper patterned boards can dissolve copper ions, and may be incorporated with complexing agents, such as, EDTA, to stabilize them.

It may be further incorporated with other additives, for example, surfactant to improve wettability of the board with the solution, and corrosion inhibitor, e.g., benzotriazole, to prevent corrosion of copper.

It is adequate that the pretreatment solution of the present invention is used at 5 to 50° C., preferably 15 to 30° C.

The pretreatment method of the present invention may be applied, immediately before a series of the pretreatment steps for electroless nickel plating by immersing the board into contact with the solution, by immersing the board in the treatment solution of the present invention or spraying the treatment solution of the present invention over the board, for which showering may be used. The series of the pretreatment steps for electroless nickel plating are those commonly used prior to electroless nickel plating, and generally include a series of degreasing, soft etching, acid treatment and activator treatment prior to electroless nickel plating.

When the Pd catalyst is remained on the side walls of the holes prepared in the board, the pretreatment should be more efficiently affected by including permanganate treatment and neutralization steps before the thiosulfate treatment.

For the permanganate treatment, the boards are immersed in an acidic aqueous solution of a permanganate, where permanganate concentration is in a range from 0.5 to 50 g/L, and pH is 2 or less. For the neutralization treatment, the boards are immersed in an aqueous solution dissolving a reducing agent, e.g., hydroxylamine sulfate.

The neutralization treatment immerses the board in an aqueous solution dissolving a reducing agent, e.g., hydroxyamine sulfate. One of the examples of the aqueous solution is that dissolving hydroxylamine sulfate at 0.5 to 50 g/L and 96% sulfuric acid at 0.1 to 30 mL/L.

EXAMPLES

The present invention will be described by Examples, which by no means limit the present invention.

Examples and Comparative Examples

Copper circuit patterns (line/space=100 $\mu$m/100 $\mu$m) are prepared by etching some copper clad laminated boards (size 100 mm by 100 mm).

The board was immersed in a solution with the following composition for 5 minutes to reproduce the condition of a Pd catalyst remaining between the patterns, and then rinsed with water and dried.

Palladium chloride (as Pd): 100 mg/L
Ammonium chloride: 10 g/L
Adjusted at pH 2.0 with hydrochloric acid The above board was immersed in the pretreatment solutions of following compositions, and then washed with water and dried.

Example 1

Potassium thiosulfate: 50 g/L
pH: 6
pH adjuster: Sodium citrate

Example 2

Sodium thiosulfate: 30 g/L
pH: 9
pH adjuster: Potassium pyrophosphate

Example 3

Potassium thiosulfate: 30 g/L
pH: 6 pH adjuster: Potassium citrate
Corrosion inhibitor: Benzotriazole

Example 4

Sodium thiosulfate: 50 g/L
pH: 9
pH adjuster: Sodium pyrophosphate
Complexing agent: EDTA.2Na
Surfactant: Polyoxyethylenenonylphenyl ether
Each of the above boards was immersed in the pretreatment solution under the following conditions:
Solution temperature: 25° C.
Immersion time: 5 min Example 5

The same procedure as used for Example 1 was repeated, except permanganate treatment and neutralization were effected before the pretreatment, using following permanganate treatment and neutralization solutions:

Permanganate treatment solution
    Potassium permanganate: 5 g/L
    Sulfuric acid (96%): 10 mL/L
Neutralization solution
    Hydroxyamine sulfate: 10 g/L
    Sulfuric acid (96%): 0.5 mL/L On the other hand, the board with no pretreatment (Comparative Example 1), and that immersed in the following solution instead of pretreatment of examples (Comparative Example 2) were prepared.

Comparative Example 2

Potassium carbonate: 50 g/L
pH: 10

Each of the boards prepared by Examples and Comparative Examples was treated by immersing in the consecutive steps of solutions, that is, degreasing, soft etching, acid treatment, activator treatment. Then the board was immersed in electroless nickel plating solution and electroless gold plating solution.

The extent of "bridging" between lines for each board was observed using microscope. The results are listed in Table 1.

TABLE 1

|  | Example 1 | Example 2 | Example 3 | Example 4 | Example 5 | Comparative Example 1 | Comparative Example 2 |
|---|---|---|---|---|---|---|---|
| Permanganate treatment and neutralization Pretreatment solutions | — | — | — | — | Yes | — | — |
| Major ingredient | Potassium thiosulfate 50 g/L | Sodium thiosulfate 30 g/L | Potassium thiosulfate 30 g/L | Sodium thiosulfate 50 g/L | Potassium thiosulfate 50 g/L | — | Potassium carbonate 50 g/L |
| pH adjuster | Sodium citrate | Potassium pyrophosphate | Potassium citrate | Sodium pyrophosphate | Sodium citrate | — | — |
| Complexing | — | — | — | EDTA.2Na | — | — | — |

TABLE 1-continued

|  | Example 1 | Example 2 | Example 3 | Example 4 | Example 5 | Comparative Example 1 | Comparative Example 2 |
|---|---|---|---|---|---|---|---|
| agent |  |  |  |  |  |  |  |
| Surfactant | — | — | — | Polyoxyethylenenonylphenyl ether | — | — | — |
| Corrosion inhibitor | — | — | Benzotriazole | — | — | — | — |
| Pretreatment conditions |  |  |  |  |  |  |  |
| pH | 6 | 9 | 6 | 9 | 6 | — | 10 |
| Temperature (° C.) | 25 | 25 | 25 | 25 | 25 | — | 25 |
| time (min) | 5 | 5 | 5 | 5 | 5 | — | 5 |
| Method | Immersion | Immersion | Immersion | Immersion | Immersion | — | Immersion |
| Results | No "bridging" of plated nickel or gold observed between the lines | No "bridging" of plated nickel or gold observed between the lines | No "bridging" of plated nickel or gold observed between the lines | No "bridging" of plated nickel or gold observed between the lines | No "bridging" of plated nickel or gold observed between the lines | "bridging" of plated nickel or gold observed between the lines, partly short-circuited | "bridging" of plated nickel or gold observed between the lines, partly short-circuited |

Each of the boards prepared by Examples showed no "bridging" of plated nickel or gold between the lines. On the other hand, each of the boards prepared by each Comparative Example showed "bridging" phenomenon of plated nickel or gold between lines, and partly short-circuited.

ADVANTAGES OF THE INVENTION

The pretreatment solution of the present invention for electroless nickel plating can prevent a "bridge" by electrolessly plated nickel or gold between the copper patterns, thereby solving the problem of short-circuit by the bridge. It exhibits particularly notable effect for the board prepared by the build-up method, which tends to cause residual Pd catalyst between the patterns.

What is claimed is:

1. A method for inactivating a catalyst attached to a copper circuit board produced by an electroless copper plating technique, comprising the steps of applying an aqueous thiosulfate solution selected from the group consisting of sodium thiosulfate, potassium thiosulfate, and ammonium thiosulfate to the electrolessly copper plated circuit board, and thereafter, electrolessly nickel plating the copper circuit board.

2. A method of manufacturing a copper circuit board, comprising the steps of:

applying a catalyst on a resin circuit board;

after said catalyst is applied on said circuit board, electrolessly copper plating said circuit board with a copper layer and etching said copper layer to form a copper circuit on said circuit board;

applying an aqueous thiosulfate solution selected from the group consisting of sodium thiosulfate, potassium thiosulfate, and ammonium thiosulfate to said circuit board after said copper circuit is formed on said circuit board; and electrolessly nickel plating said copper circuit after said circuit board is applied with said thiosulfate solution;

wherein said catalyst promotes deposition of said copper layer on said circuit board, and said thiosulfate solution inactivates said catalyst to prevent bridging of said copper circuit during said electrolessly nickel plating step.

3. A method according to claim 2, wherein said thiosulfate solution contains at least one additive selected from the group consisting of a pH adjustor, a complexing agent, a surfactant, and a corrosion inhibitor.

4. A method according to claim 2, wherein said thiosulfate solution applying step includes immersing the board in said thiosulfate solution.

5. A method according to claim 2, wherein said thiosulfate solution applying step includes spraying the board with said thiosulfate solution.

* * * * *